(12) United States Patent
Kim et al.

(10) Patent No.: US 12,389,545 B2
(45) Date of Patent: Aug. 12, 2025

(54) SEMICONDUCTOR PACKAGES HAVING CIRCUIT BOARDS

(71) Applicant: SAMSUNG ELECTRONICS CO., LTD., Suwon-si (KR)

(72) Inventors: Sunjae Kim, Seoul (KR); Kyongsoon Cho, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 436 days.

(21) Appl. No.: 18/079,267

(22) Filed: Dec. 12, 2022

(65) Prior Publication Data

US 2023/0254975 A1 Aug. 10, 2023

(30) Foreign Application Priority Data

Feb. 9, 2022 (KR) .......................... 10-2022-0016602

(51) Int. Cl.
*H05K 1/18* (2006.01)
*H01L 23/057* (2006.01)
(Continued)

(52) U.S. Cl.
CPC ............ *H05K 1/183* (2013.01); *H05K 1/0274* (2013.01); *H05K 2201/09036* (2013.01);
(Continued)

(58) Field of Classification Search
CPC ......... H05K 1/183; H05K 2201/09036; H05K 2201/09072; H05K 2201/09427;
(Continued)

(56) References Cited

U.S. PATENT DOCUMENTS 6,396,116 B1 * 5/2002 Kelly .................... H10F 77/50
257/E31.127
6,696,738 B1 * 2/2004 Tu ......................... H10F 39/804
438/57
(Continued)

FOREIGN PATENT DOCUMENTS

KR 10-0803244 2/2008
KR 10-0957384 5/2010
(Continued)

*Primary Examiner* — Timothy J Thompson
*Assistant Examiner* — Amol H Patel
(74) *Attorney, Agent, or Firm* — Morgan, Lewis & Bockius LLP

(57) ABSTRACT

A semiconductor package that includes a circuit board having an opening therein. The circuit board includes a first portion, and a second portion disposed below the first portion. The first portion protrudes further in a horizontal direction towards the opening than the second portion. A transparent substrate is disposed on the circuit board. An image sensor chip is mounted on the circuit board. The image sensor chip includes an active array region facing the transparent substrate. A connection terminal directly contacts a lower surface of the first portion of the circuit board and an upper surface of the image sensor chip. A gap-fill member covers the connection terminal and covers a portion of an upper surface of the image sensor chip and at least a portion of a lateral side surface of the image sensor chip. The transparent substrate has a greater horizontal width than the circuit board.

20 Claims, 12 Drawing Sheets

(51) Int. Cl.
  *H01L 23/13* (2006.01)
  *H05K 1/02* (2006.01)
  *H05K 3/00* (2006.01)
  *H10F 39/00* (2025.01)
(52) U.S. Cl.
  CPC .............. *H05K 2201/09427* (2013.01); *H05K 2201/10121* (2013.01); *H05K 2201/10628* (2013.01); *H05K 2201/10977* (2013.01)
(58) Field of Classification Search
  CPC .......... H05K 2201/10121; H05K 2201/10151; H05K 2201/10977; H10F 39/806; H10F 39/811; H10F 39/80; H10F 39/026; H10F 39/804; H01L 23/13; H01L 23/057
  See application file for complete search history.

(56) References Cited

U.S. PATENT DOCUMENTS

| | | | |
|---|---|---|---|
| 6,774,481 B2* | 8/2004 | Ono | H10F 39/1515 |
| | | | 257/793 |
| 9,024,403 B2* | 5/2015 | Park | H10F 39/804 |
| | | | 257/E31.127 |
| 10,615,212 B2 | 4/2020 | Jung et al. | |
| 2008/0079829 A1 | 4/2008 | Choi et al. | |
| 2008/0083980 A1* | 4/2008 | Yang | H10F 39/011 |
| | | | 257/E27.15 |
| 2011/0193231 A1* | 8/2011 | Elenius | H01L 24/13 |
| | | | 257/E21.59 |
| 2012/0018830 A1* | 1/2012 | Lin | H10F 39/804 |
| | | | 257/E31.127 |
| 2016/0254302 A1* | 9/2016 | Ichiki | H10F 39/804 |
| | | | 257/433 |
| 2020/0303448 A1* | 9/2020 | Wang | H10F 39/811 |
| 2020/0321375 A1* | 10/2020 | Wu | H10F 39/809 |
| 2021/0193716 A1* | 6/2021 | Lin | H10F 39/806 |
| 2022/0262841 A1* | 8/2022 | Shigeta | H10F 39/809 |

FOREIGN PATENT DOCUMENTS

| | | |
|---|---|---|
| KR | 10-1026487 | 3/2011 |
| KR | 10-1905407 | 10/2018 |
| KR | 10-2019353 | 9/2019 |
| KR | 10-2052804 | 11/2019 |
| KR | 10-2021-0061799 | 5/2021 |

* cited by examiner

SEMICONDUCTOR PACKAGES HAVING CIRCUIT BOARDS

CROSS-REFERENCE TO THE RELATED APPLICATION

This application claims priority under 35 U.S.C. § 119 to Korean Patent Application No. 10-2022-0016602, filed on Feb. 9, 2022 in the Korean Intellectual Property Office, the disclosure of which is incorporated herein by reference in its entirety herein.

TECHNICAL FIELD

Embodiments of the present inventive concept relate to a semiconductor package having a circuit board.

DISCUSSION OF RELATED ART

An image sensor such as a CMOS image sensor may be applied to various electronic products, such as a mobile phone, a digital camera, an optical mouse, a surveillance camera, and a biometric recognition device. The semiconductor package including the image sensor may be miniaturized so that the electronic products that the semiconductor package is applied to are miniaturized and multifunctional.

SUMMARY

Embodiments of the present inventive concept provide a semiconductor package including a circuit board having a recessed region in which an image sensor chip is mounted.

According to an embodiment of the present inventive concept, a semiconductor package includes a circuit board having an opening therein. The circuit board includes a first portion and a second portion disposed below the first portion. The first portion protrudes further in a horizontal direction towards the opening than the second portion. A transparent substrate is disposed on the circuit board. An image sensor chip is mounted on the circuit board. The image sensor chip includes an active array region facing the transparent substrate. A connection terminal directly contacts a lower surface of the first portion of the circuit board and an upper surface of the image sensor chip. A gap-fill member covers the connection terminal and covers a portion of an upper surface of the image sensor chip and at least a portion of a lateral side surface of the image sensor chip. The transparent substrate has a greater horizontal width than the circuit board.

According to an embodiment of the present inventive concept, a semiconductor package includes a circuit board having an opening therein. The circuit board includes a first portion and a second portion disposed below the first portion. The second portion extends further in a horizontal direction than the first portion in a cross-sectional view. A transparent substrate is disposed on the circuit board. An image sensor chip is mounted on the circuit board. The image sensor chip includes an active array region facing the transparent substrate. A connection terminal contacts an upper surface of the second portion of the circuit board and a lower surface of the image sensor chip. A gap-fill member covers the connection terminal and covers at least portions of a lower surface and a lateral side surface of the image sensor chip. The transparent substrate has a greater horizontal width than the circuit board.

According to an embodiment of the present inventive concept, a semiconductor package includes a circuit board having an opening therein. The circuit board includes a first portion and a second portion disposed below the first portion. The first portion protrudes further in a horizontal direction towards the opening than the second portion. A transparent substrate is disposed on the circuit board. An adhesive is between the circuit board and the transparent substrate. An image sensor chip is mounted on the circuit board. The image sensor chip includes an upper semiconductor chip including a photoelectric conversion device, a lower semiconductor chip bonded to the upper semiconductor chip, the lower semiconductor chip including a lower wiring layer, and an active array region on the upper semiconductor chip. A connection terminal directly contacts a lower surface of the first portion of the circuit board and an upper surface of the image sensor chip. A gap-fill member covers the connection terminal and covers a portion of an upper surface of the image sensor chip and at least a portion of a lateral side surface of the image sensor chip. The transparent substrate has a greater horizontal width than the circuit board.

DETAILED DESCRIPTION OF EMBODIMENTS

Figure 1:
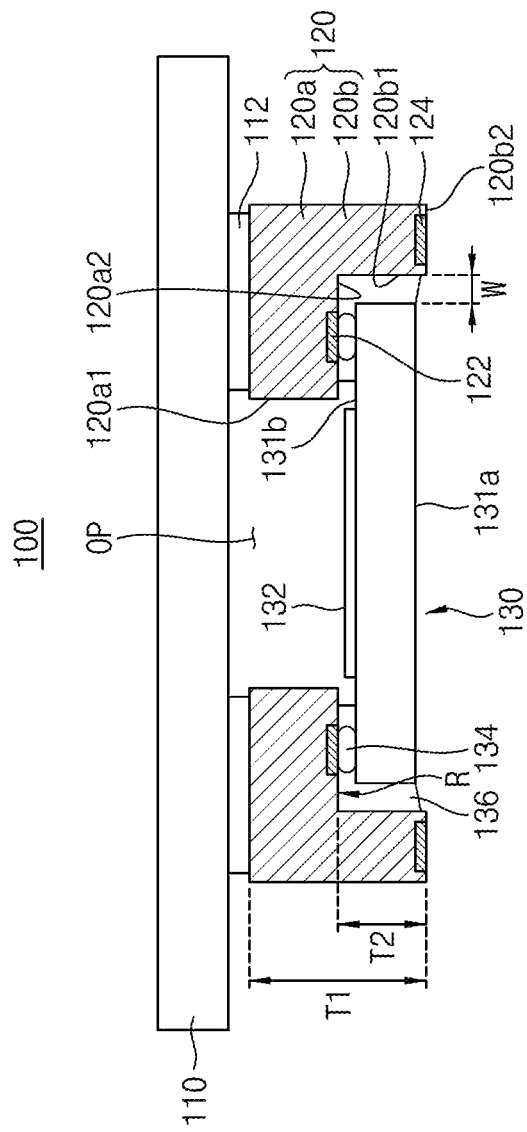
FIG. 1 is a cross-sectional view of a semiconductor package according to an embodiment of the present inventive concept.
Figure 2:
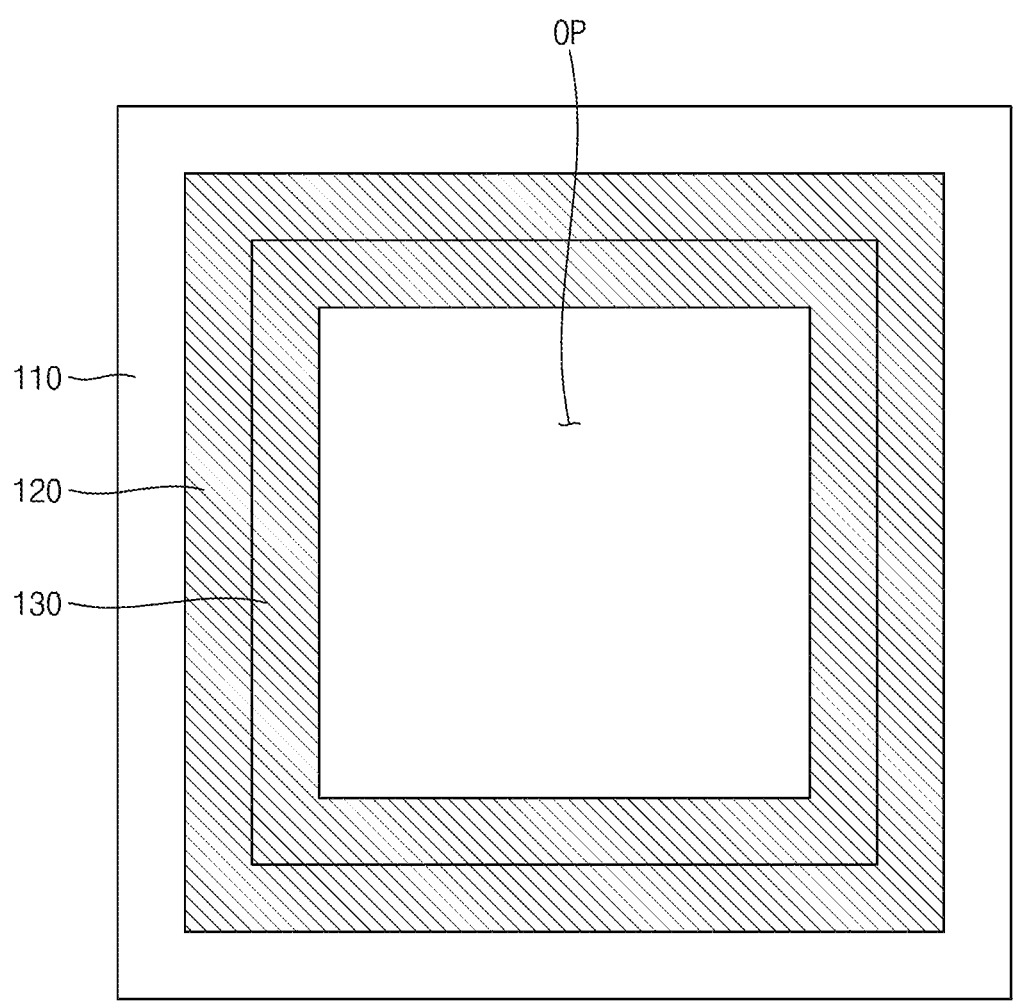
FIG. 2 is a plan view of the semiconductor package shown in FIG. 1 according to an embodiment of the present inventive concept.

FIG. 1 is a vertical cross-sectional view of a semiconductor package according to an embodiment of the present inventive concept. FIG. 2 is a plan view of the semiconductor package shown in FIG. 1.

Referring to FIG. 1, a semiconductor package 100 may include a transparent substrate 110, an adhesive 112, a circuit board 120, and an image sensor chip 130. The transparent substrate 110 may be attached to the circuit board 120 by the adhesive 112, and may face the image sensor chip 130. In an embodiment, the transparent substrate 110 may have a greater horizontal width than the circuit board 120. For example, the horizontal width of the transparent substrate 110 may be greater than the maximum horizontal width of the circuit board 120.

In an embodiment, the transparent substrate 110 may include a transparent polymer material such as acryl or may be glass. In an embodiment, the transparent substrate 110 may filter out a particular component of incident light entering the image sensor chip 130. For example, the transparent substrate 110 may include an infrared (IR) cut filter. Alternatively, the transparent substrate 110 may include an IR cut material.

The adhesive 112 may be disposed between the transparent substrate 110 and the circuit board 120 (e.g., in a thickness direction of the semiconductor package 100). For example, in an embodiment the adhesive 112 may directly contact a lower surface of the transparent substrate 110 and an upper surface of the circuit board 120. In an embodiment, the adhesive 112 may have a smaller horizontal width than the upper surface of the circuit board 120. The adhesive 112 may include a polymer-based material. In an embodiment, the adhesive 112 may include a light-to-heat conversion (LTHC) release coating material, and may be thermally released by heat. Alternatively, in an embodiment, the adhesive 112 may include an ultraviolet (UV) adhesive 112 releasable by UV light.

The circuit board 120 may be attached to the adhesive 112, and may be electrically connected to the image sensor chip 130. As shown in FIG. 2, the circuit board 120 may include an opening OP therein, and the circuit board 120 may extend in a horizontal direction to surround the opening OP. For example, in an embodiment, in a plan view, the opening OP may be rectangular, and the circuit board 120 may be a hollow rectangular shape (e.g., a frame shape). The opening OP may expose the image sensor chip 130, and may allow incident light introduced through the transparent substrate 110 to be transferred to the image sensor chip 130.

Again referring to FIG. 1, the circuit board 120 may include a recessed region R formed at a lower surface thereof (e.g., a surface opposite to a surface facing the transparent substrate 110). The recessed region R may extend in the horizontal direction. In an embodiment, the circuit board 120 may include a first portion 120a contacting the adhesive 112, and a second portion 120b disposed below the first portion 120a. The first portion 120a and the second portion 120b may extend in the horizontal direction, and may have a frame shape in a plan view. In a cross-sectional view, the first portion 120a may have a shape extending further in the horizontal direction than the second portion 120b. For example, the first portion 120a may protrude further in a direction towards the opening OP than the second portion 120b. A lower surface 120a2 of the first portion 120a and an inner side surface 120b1 of the second portion 120b may be exposed by the recessed region R. An inner side surface 120a1 of the first portion 120a extending in the horizontal direction may be exposed by the opening OP. In an embodiment, the second portion 120b may be formed integrally with the first portion 120a, and the inner side surface 120b1 of the second portion 120b may extend in the horizontal direction. The lower surface 120a2 of the first portion 120a and the inner side surface 120b1 of the second portion 120b may face the image sensor chip 130.

In an embodiment, a horizontal width W between the inner side surface 120b1 of the second portion 120b and the image sensor chip 130 (e.g., a lateral side of the image sensor chip 130) may be in a range of about 250 μm to about 1,000 μm. In an embodiment, a total thickness T1 of the circuit board 120 (e.g., a sum of thicknesses of the first portion 120a and the second portion 120b) may be in a range of about 500 μm to about 650 μm. A thickness T2 of the second portion 120b may be in a range of about 350 μm to about 500 μm.

In an embodiment, the circuit board 120 may include an upper pad 122 and a lower pad 124. The upper pad 122 may be disposed at the lower surface 120a2 of the first portion 120a, and the lower pad 124 may be disposed at a lower surface 120b2 of the second portion 120b. In an embodiment, the upper pad 122 may be electrically connected to the lower pad 124 by an inner wiring of the circuit board 120. The upper pad 122 may also be electrically connected to the image sensor chip 130. In an embodiment, the upper pad 122 and the lower pad 124 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). However, embodiments of the present inventive concept are not necessarily limited thereto.

In an embodiment, the circuit board 120 may include a ceramic material to decrease a coefficient of thermal expansion thereof. For example, in an embodiment the circuit board 120 may include aluminum oxide ($Al_2O_3$), zirconium oxide ($ZrO_2$), silicon nitride ($Si_3N_4$), or a combination thereof. The circuit board 120 may further include an additive such as iron (Fe), cobalt (Co), copper (Cu), etc. to increase a sintering behavior thereof. However, embodiments of the present inventive concept are not necessarily limited thereto and the material of the circuit board 120 and additive may vary.

The image sensor chip 130 may be mounted on the circuit board 120 such that the image sensor chip 130 faces the transparent substrate 110. For example, the image sensor chip 130 may include a lower surface 131a, an upper surface 1301b opposing the lower surface 131a (e.g., in a thickness direction of the semiconductor package 100), and an active array region 132 on the upper surface 131b. The opening OP of the circuit board 120 may expose the active array region 132 of the image sensor chip 130, and the active array region 132 may face the transparent substrate 110. As described above, incident light introduced through the transparent substrate 110 may be transferred to the image sensor chip 130, such as the active array region 132 of the image sensor chip 130.

In an embodiment, the lower surface 131a of the image sensor chip 130 may be disposed at a higher level than a lower surface of the circuit board 120 (e.g., the lower surface 120b2 of the second portion 120b). The upper surface 131b of the image sensor chip 130 may be disposed at a lower level than the lower surface 120a2 of the first portion 120a of the circuit board 120. In an embodiment, the distance between the upper surface 131b of the image sensor chip 130 and the lower surface 120a2 of the first portion 120a of the circuit board 120 may be in a range of about 30 μm to about 50 μm.

The semiconductor package 100 may further include a connection terminal 134 and a gap-fill member 136 disposed between the circuit board 120 and the image sensor chip 130. The connection terminal 134 may directly contact the upper surface 131b of the image sensor chip 130 and the lower surface 120a2 of the first portion 120a of the circuit board 120. For example, the connection terminal 134 may directly contact the upper pad 122 of the circuit board 120.

The connection terminal 134 may include a conductive material and, as such, the circuit board 120 and the image sensor chip 130 may be electrically interconnected via the connection terminal 134. In an embodiment, the connection terminal 134 may have a ball shape such as a circular shape, an oval shape, etc. In an embodiment, the connection terminal 134 may include Au or an Au—Pd alloy.

The gap-fill member 136 may fill a space between the circuit board 120 and the image sensor chip 130. For example, the gap-fill member 136 may cover the lower surface 120a2 of the first portion 120a and the inner side surface 120b1 of the second portion 120b of the circuit board 120, and may cover a portion of the upper surface 131b and a lateral side surface of the image sensor chip 130. The gap-fill member 136 may also cover the connection terminal 134, and may protect the connection terminal 134 from external impact. The gap-fill member 136 may not cover the active array region 132. In an embodiment, the gap-fill member 136 may include a non-conductive paste (NCP), a non-conductive film (NCF), a capillary underfill (CUF), or other insulating materials. However, embodiments of the present inventive concept are not necessarily limited thereto and a material of the gap-fill member 136 may vary.

Figure 3:
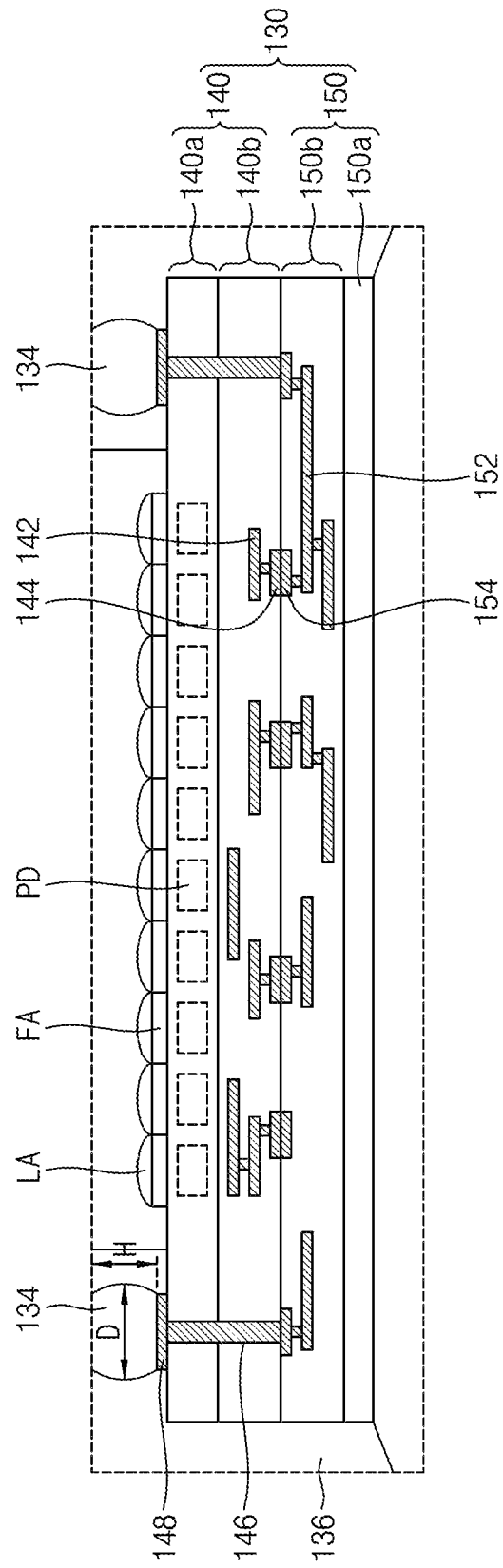
FIG. 3 is an enlarged cross-sectional view of the semiconductor package shown in FIG. 1 according to an embodiment of the present inventive concept.
Figure 4:
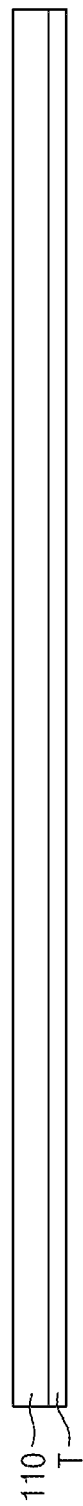
FIGS. 4 to 7 are cross-sectional views and a plan view shown in accordance with a process sequence of a semiconductor package manufacturing method according to embodiments of the present inventive concept.

FIG. 3 is an enlarged view of a portion of the semiconductor package shown in FIG. 1.

Referring to FIG. 3, the image sensor chip 130 may include an upper semiconductor chip 140 and a lower semiconductor chip 150. For example, in an embodiment the image sensor chip 130 may be formed by bonding the upper semiconductor chip 140 and the lower semiconductor chip 150 to each other.

The upper semiconductor chip 140 may include an upper semiconductor layer 140a, an upper circuit layer 140b, and a microlens array LA and a color filter array FA on the upper semiconductor layer 140a. The upper semiconductor layer 140a may include photoelectric conversion devices PD therein. The photoelectric conversion devices PD may be disposed at a central portion of the upper semiconductor layer 140a (e.g., in the horizontal direction). The photoelectric conversion devices PD may be electrically isolated from one another by a device isolation layer, and may have a conductivity type different from that of the upper semiconductor layer 140a. The upper semiconductor layer 140a may be a substrate including a semiconductor material. For example, in an embodiment the upper semiconductor layer 140a may be a silicon substrate, a germanium substrate, a silicon-germanium substrate, or a silicon-on-insulator (SOI) substrate.

The color filter array FA may be disposed on the upper semiconductor layer 140a, and the microlens array LA may be disposed on the color filter array FA. The color filter array FA may be constituted by color filters, and each of the color filters may be disposed to correspond to one of the photoelectric conversion devices PD, respectively. In an embodiment the color filters may include a red color filter, a blue color filter, and a green color filter. The color filters may have an arrangement of a Bayer structure, a Tetra structure or a Nona structure. However, embodiments of the present inventive concept are not necessarily limited thereto. The color filter array FA and the microlens array LA may be disposed at the central portion of the upper semiconductor layer 140a, and may constitute the active array region 132.

The upper circuit layer 140b may be disposed below the upper semiconductor layer 140a. In an embodiment, the upper circuit layer 140b may include an upper wiring layer 142 and an upper bonding pad 144. The upper circuit layer 140b may be electrically connected to the photoelectric conversion devices PD. For example, in an embodiment the upper circuit layer 140b may include a transistor for driving of the photoelectric conversion devices PD, and the transistor may be electrically connected to at least one of upper wiring layers 142. The upper bonding pad 144 may be disposed at a lower surface of the upper circuit layer 140b, and may be electrically connected to at least one of the upper wiring layers 142. The upper circuit layer 140b may further include an interlayer insulating layer coveting the upper wiring layer 142 and the upper bonding pad 144.

The upper semiconductor chip 140 may further include an upper through via 146 and a connection pad 148. In an embodiment, the upper through via 146 may vertically extend from an upper surface of the upper semiconductor layer 140a through the upper semiconductor layer 140a and the upper circuit layer 140b. The connection pad 148 may be disposed at the upper surface of the upper semiconductor layer 140a, and may directly contact the upper through via 146. The connection pad 148 may also contact the connection terminal 134 and, as such, may electrically interconnect the connection terminal 134 and the upper through via 146. In an embodiment, the connection pad 148 may indirectly contact the through via 146. For example, a pad may be disposed on the upper surface of the upper semiconductor layer 140a and is electrically connected to the connection pad 148 and may directly contact the through via 146 and the connection pad 148. In an embodiment, the upper wiring layer 142, the upper bonding pad 144, the upper through via 146, and the connection pad 148 may include a metal such as aluminum (Al), titanium (Ti), chromium (Cr), iron (Fe), cobalt (Co), nickel (Ni), copper (Cu), zinc (Zn), lead (Pd), platinum (Pt), gold (Au), and silver (Ag). However, embodiments of the present inventive concept are not necessarily limited thereto. In an embodiment, a horizontal width D of the connection terminal 134 (e.g., the maximum horizontal width of the connection terminal 134) may be in a range of about 50 μm to about 70 μm. A height H of the connection terminal 134 may be in a range of about 40 μm to about 65 μm. In an embodiment, the lower semiconductor chip 150 may be disposed below the upper semiconductor chip 140, and may be a logic chip including logic circuits configured to drive the image sensor chip 130. The lower semiconductor chip 150 may include a lower semiconductor layer 150a and a lower circuit layer 150b. The lower semiconductor layer 150a may be a substrate including a semiconductor material. For example, in an embodiment the lower semiconductor layer 150a may be a silicon substrate, a germanium substrate, a silicon-germanium substrate, or a silicon-on-insulator (SOI) substrate. However, embodiments of the present inventive concept are not necessarily limited thereto. The logic circuit may be disposed on the lower semiconductor layer 150a.

In an embodiment, the lower circuit layer 150b may be disposed on the lower semiconductor layer 150a, and may directly contact the upper circuit layer 140b. For example, the lower circuit layer 150b may include a lower wiring layer 152 and a lower bonding pad 154. The lower wiring layer 152 may be electrically connected to the logic circuit. Some of the lower bonding pads 154 may be bonded to the upper bonding pad 144 corresponding thereto. Some of the lower bonding pads 154 may be bonded to the upper through via 146. The lower semiconductor chip 150 may be electrically connected to the connection terminal 134 through the upper through via 146. The lower circuit layer 150b may further include an interlayer insulating layer covering the lower wiring layer 152 and the lower bonding pad 154.

FIGS. 4 to 7 are vertical cross-sectional views and a plan view shown in accordance with a process sequence to explain a semiconductor package manufacturing method according to embodiments of the present inventive concept.

In an embodiment, a semiconductor package 100 may be formed through wafer-level packaging (WLP). For example, referring to FIG. 4, a protective tape T and a transparent substrate 110 on the protective tape T may be provided. In an embodiment, the transparent substrate 110 may have a plate shape and, for example, may have a disc shape.

Figure 5:
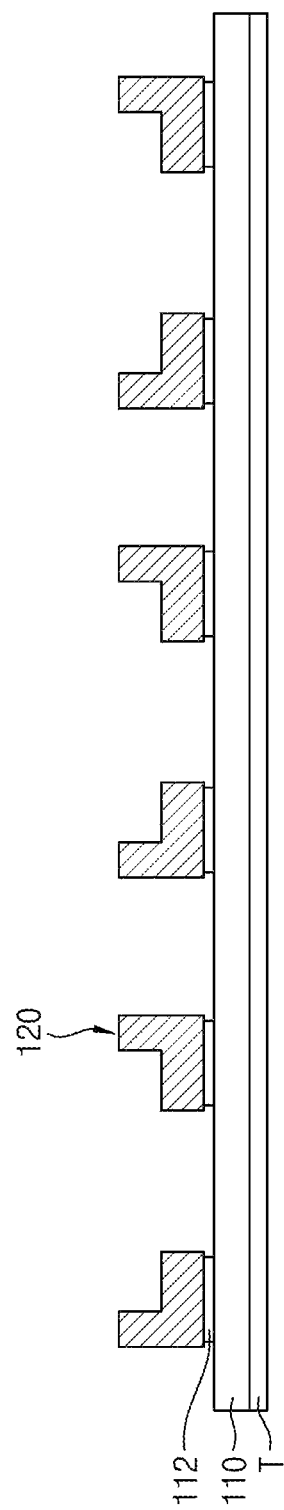

Referring to FIG. 5, circuit boards 120 may be disposed on the transparent substrate 110. In an embodiment, the circuit boards 120 may be disposed to be spaced apart from one another by a uniform distance, and may be attached to the transparent substrate 110 by an adhesive 112. For example, the adhesive 112 may be an ultraviolet (UV) adhesive.

Figure 6:
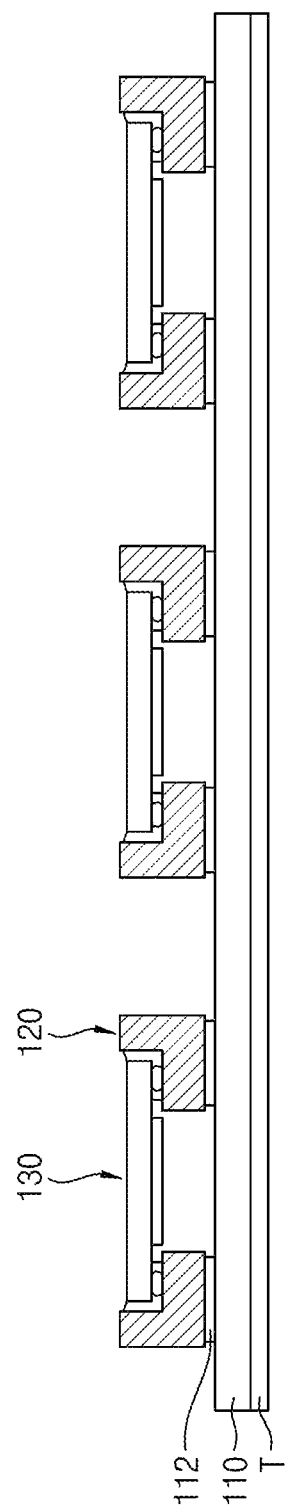

Referring to FIG. 6, an image sensor chip 130 may be mounted on the circuit board 120. As described above with reference to FIG. 1, the image sensor chip 130 may be mounted such that an active array region 132 thereof faces the transparent substrate 110, and may be connected to the circuit board 120 by a connection terminal 134. In an embodiment, the connection terminal 134 may be formed in the same manner as wire bonding. For example, the connection terminal 134 may be formed by attaching a conductive material connected to a wire to a connection pad 148 and separating the conductive material from the wire. The wire bonding process may proceed at a relatively low temperature as compared to a molding process involving covering with an insulating material such as an epoxy resin, and, as such, may prevent damage to the circuit board 120 and the image sensor chip 130 caused by thermal expansion in a manufacturing process.

After mounting of the image sensor chip 130, a gap-fill member 136 may be provided between the circuit board 120 and the image sensor chip 130. In an embodiment, the gap-fill member 136 may be provided through dispensing. For example, the gap-fill member 136 may be provided to a space between an inner side surface 120b1 of a second portion 120b of the circuit board 120 and a lateral side surface of the image sensor chip 130, and then flow into a space between a lower surface 120a2 of a first portion 120a of the circuit board 120 and an upper surface 131b of the image sensor chip 130, to cover the connection terminal 134.

Figure 7:
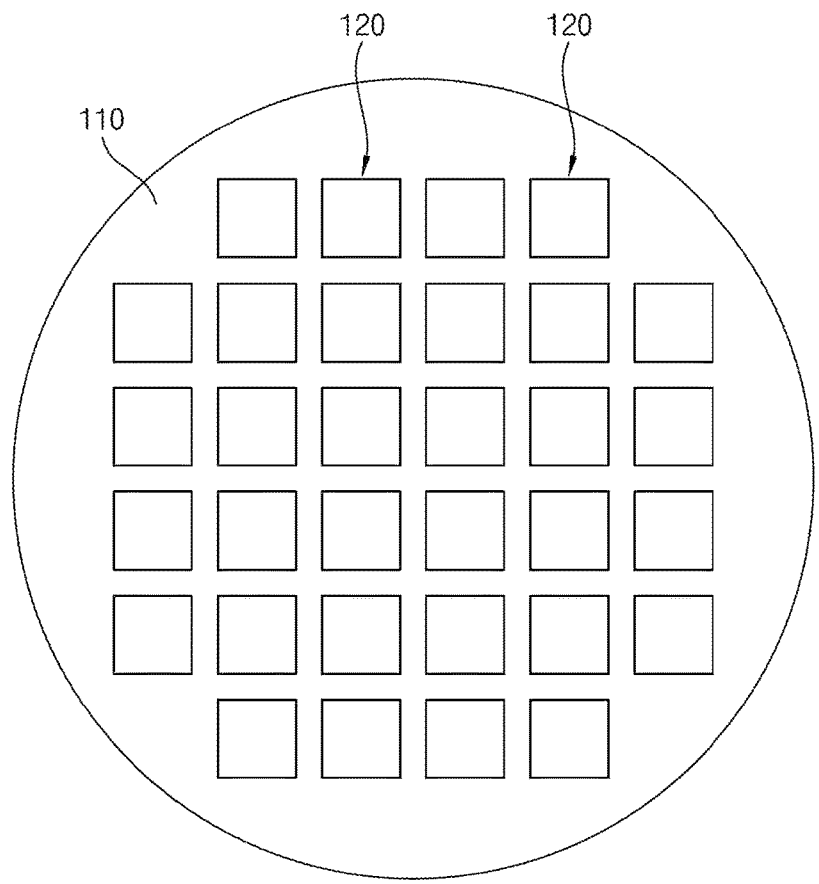

FIG. 7 is a top plan view corresponding to FIG. 6. As shown in FIG. 7, the circuit boards 120 may be disposed on the transparent substrate 110, to be spaced apart from one another by a uniform distance, and image sensor chips 130 may be mounted on the circuit boards 120, respectively. In an embodiment, the transparent substrate 110 may be cut to singulate the circuit boards 120 and, as such a semiconductor package 100 shown in FIG. 1 may be formed.

The semiconductor package 100 according to an embodiment of the present inventive concept may include a circuit board 120 formed with a recessed region R, and an image sensor chip 130 may be mounted in the recessed region R and, as such, the semiconductor package 100 may have a reduced size. In addition, no molding process for covering the circuit board 120 with a material such as an epoxy resin is performed and, as such, damage caused by thermal expansion of a molding member may be reduced.

Figure 8:
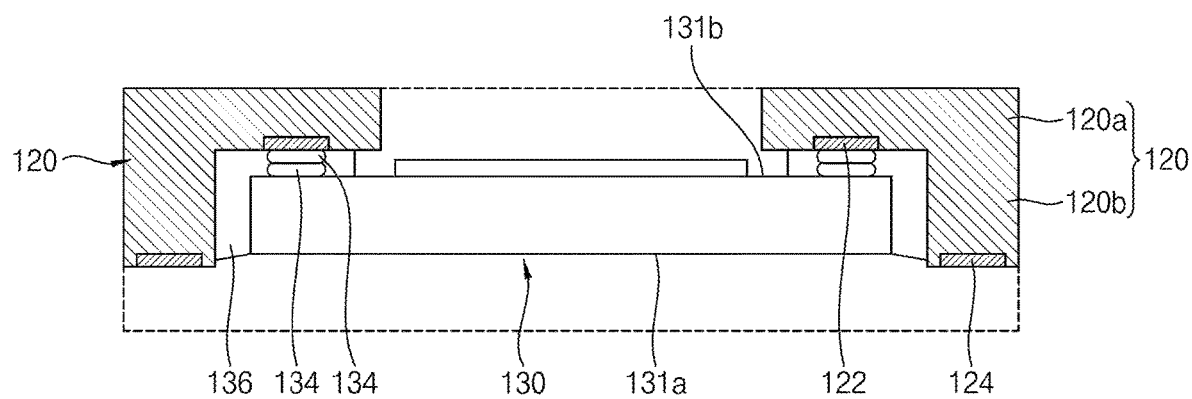
FIGS. 8 and 9 are cross-sectional views of semiconductor packages according to embodiments of the present inventive concept.
Figure 9:
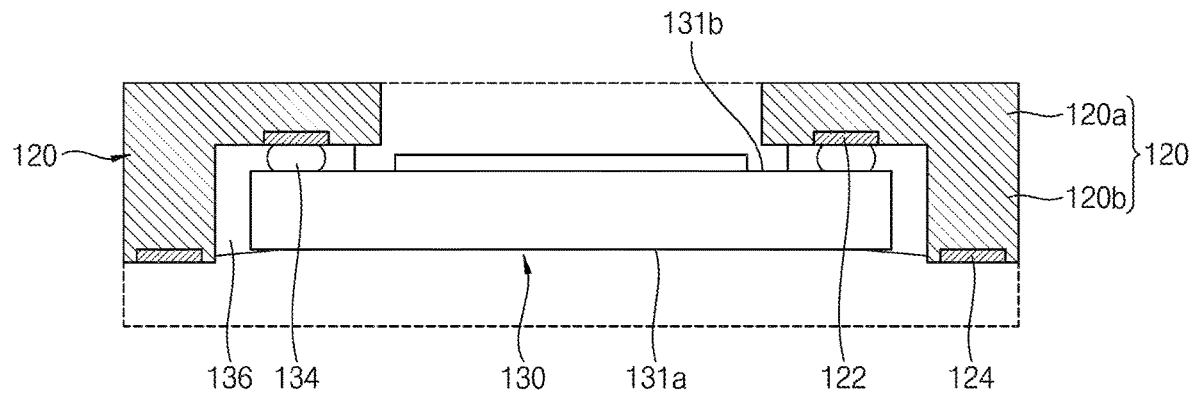

FIGS. 8 and 9 are cross-vertical sectional views of semiconductor packages according to embodiments of the present inventive concept. For example, FIGS. 8 and 9 are enlarged views of vertical cross-sectional views of the semiconductor packages according to embodiments of the present inventive concept.

Referring to FIG. 8, a semiconductor package 100 may include a plurality of connection terminals 134 interconnecting a circuit board 120 and an image sensor chip 130. For example, the plurality of connection terminals 134 may have a stack structure in which the plurality of connection terminals 134 is sequentially stacked on an upper surface 131b of the image sensor chip 130. As described with reference to FIG. 6, in an embodiment the connection terminal 134 may be formed by separating, from a wire, a conductive material connected to the wire in a wire bonding process. In an embodiment, a plurality of connection terminals 134 may be stacked using the above-described method, to satisfy a predetermined height condition. Although two connection terminals 134 are illustrated in FIG. 8, embodiments of the present inventive concept are not necessarily limited thereto. For example, in some embodiments, three or more connection terminals 134 may form a stack structure.

Referring to FIG. 9, in an embodiment, a gap-fill member 136 may partially cover a lower surface 131a of an image sensor chip 130. As described with reference to FIG. 6, the gap-fill member 136 may be provided to a space between an inner side surface 120b1 of a second portion 120b of a circuit board 120 and a lateral side surface of the image sensor chip 130, and may then flow to cover an upper surface 131b of the image sensor chip 130. In an embodiment, the gap-fill member 136 may overflow and, as such, may cover a lower surface 131a of the image sensor chip 130. However, the gap-fill member 136 may not cover a lower surface of the circuit board 120.

Figure 10:
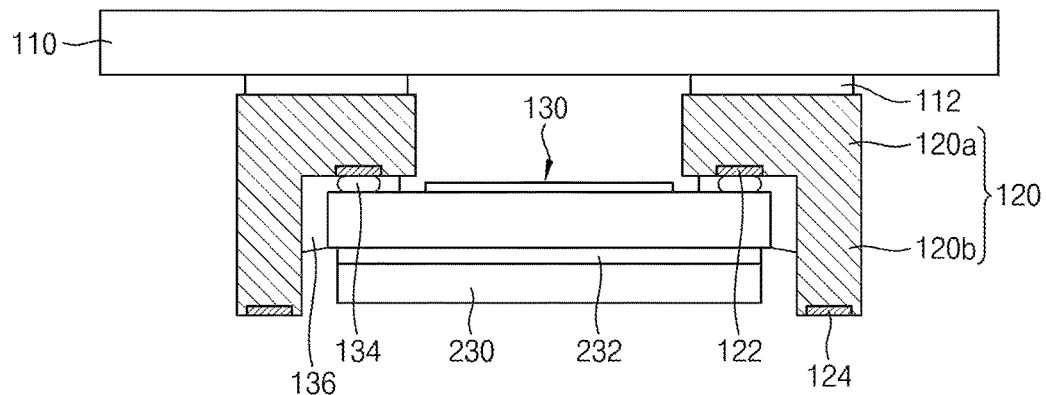
FIG. 10 is a cross-sectional view of a semiconductor package according to an embodiment of the present inventive concept.

FIG. 10 is a vertical cross-sectional view of a semiconductor package according to an embodiment of the present inventive concept.

Referring to FIG. 10, a semiconductor package 200 according to an embodiment may further include a heat spreader 230 and an adhesive film 232 disposed below an image sensor chip 130. The heat spreader 230 may be attached to the image sensor chip 130 by the adhesive film 232. For example, the adhesive film 232 may be disposed on a lower surface 131a of the image sensor chip 130, and the heat spreader 230 may be disposed on the adhesive film 232. In an embodiment, a lower surface of the heat spreader 230 may be disposed at a higher level than a lower surface of a circuit board 120. Although a gap-fill member 136 is shown in FIG. 10 as not directly contacting the heat spreader 230 and the adhesive film 232, embodiments of the present inventive concept are not necessarily limited thereto and the gap-fill member 136 may directly contact the heat spreader 230 and the adhesive film 232 in some embodiments.

The heat spreader 230 may assist in discharge of heat generated from the image sensor chip 130. In an embodiment, the heat spreader 230 may be a dummy substrate, and may include silicon. In an embodiment, the heat spreader 230 may include a metal such as silver (Ag), copper (Cu), nickel (Ni), and gold (Au). The adhesive film 232 may include a thermal interface material (TIM) including polymer, resin or epoxy together with a filler. The filler may include a dielectric filler such as aluminum oxide, magnesium oxide, aluminum nitride, boron nitride, and diamond powder. The filler may be a metal filler such as silver, copper, aluminum or the like. However, embodiments of the present inventive concept are not necessarily limited thereto and the materials of the heat spreader 230 and the adhesive film 232 may vary.

Figure 11:
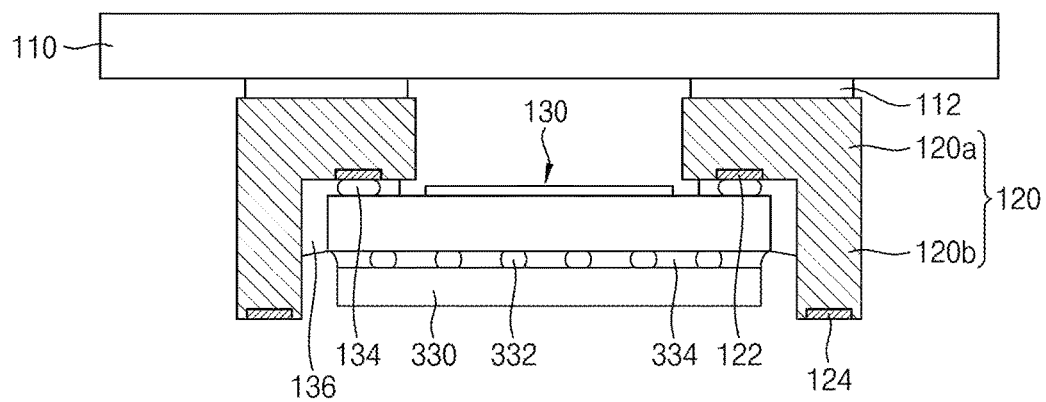
FIG. 11 is a cross-sectional view of a semiconductor package according to an embodiment of the present inventive concept.
Figure 12:
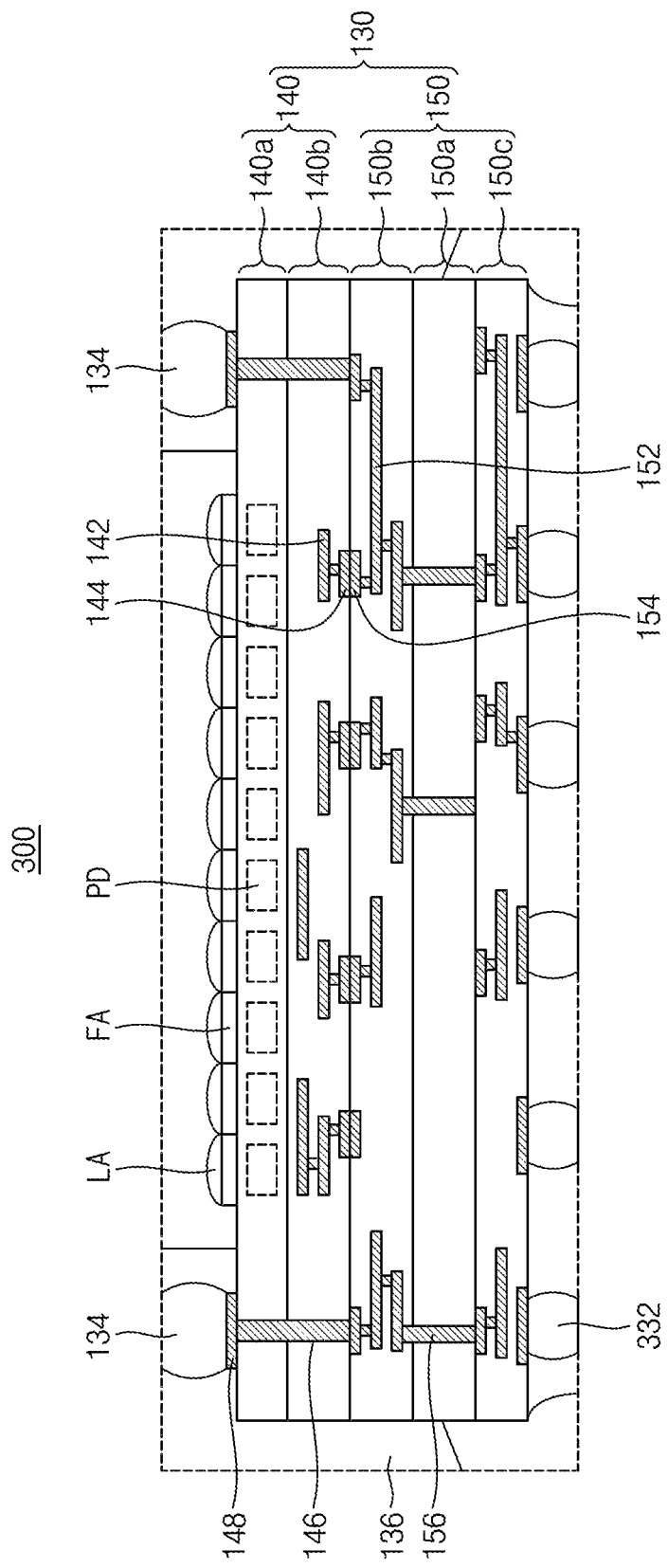
FIG. 12 is an enlarged cross-sectional view of the semiconductor package shown in FIG. 11 according to an embodiment of the present inventive concept.

FIG. 11 is a vertical cross-sectional view of a semiconductor package according to an embodiment of the present inventive concept. FIG. 12 is an enlarged view of a portion of the semiconductor package shown in FIG. 11.

Referring to FIG. 11, a semiconductor package 300 according to an embodiment may further include a semiconductor chip 330, a bump 332 and an underfill 334 disposed below an image sensor chip 130. In an embodiment, the semiconductor chip 330 may be a memory chip such as DRAM, SRAM, MRAM or flash memory. The semiconductor chip 330 may be connected to the image sensor chip 130 by the bump 332, and the underfill 334 may fill a space between the image sensor chip 130 and the semiconductor chip 330, and may cover bumps 332. A lower surface of the semiconductor chip 330 may be disposed at a higher level than a lower surface of the circuit board 120. Although FIG. 11 shows that only one semiconductor chip 330 is disposed below the image sensor chip 130, embodiments of the present inventive concept are not necessarily limited thereto. For example, in some embodiments, a plurality of semiconductor chips may be disposed below the image sensor chip 130.

Referring to FIG. 12, an upper semiconductor chip 140 of the semiconductor package 300 may have the same structure as the upper semiconductor chip 140 of the semiconductor package 100 shown in FIG. 3. In an embodiment, a lower semiconductor chip 150 of the semiconductor package 300 may include a lower semiconductor layer 150a, a lower circuit layer 150b, a redistribution layer 150c, and a lower through via 156. The lower semiconductor layer 150a and the lower circuit layer 150b of the semiconductor package 300 may have the same structures as the lower semiconductor layer 150a and the lower circuit layer 150b of the semiconductor package 100 shown in FIG. 3, respectively.

The redistribution layer 150c may be disposed below the lower semiconductor layer 150a, and may directly contact the bump 332. The redistribution layer 150c may include wiring layers therein, and the wiring layers may electrically interconnect the bump 332 and the lower circuit layer 150b. For example, the lower through via 156 may extend from the lower circuit layer 150b to the redistribution layer 150c while extending through the lower semiconductor layer 150a. The lower through via 156 may be electrically connected to the lower circuit layer 150b and at least one of the wiring layers of the redistribution layer 150c. Although the gap-fill member 136 is shown in FIGS. 11 and 12 as not directly contacting the semiconductor chip 330 and the underfill 334, embodiments of the present inventive concept are not necessarily limited thereto and the gap-fill member 36 may directly contact the semiconductor chip 330 and the underfill 334 in some embodiments.

Figure 13:
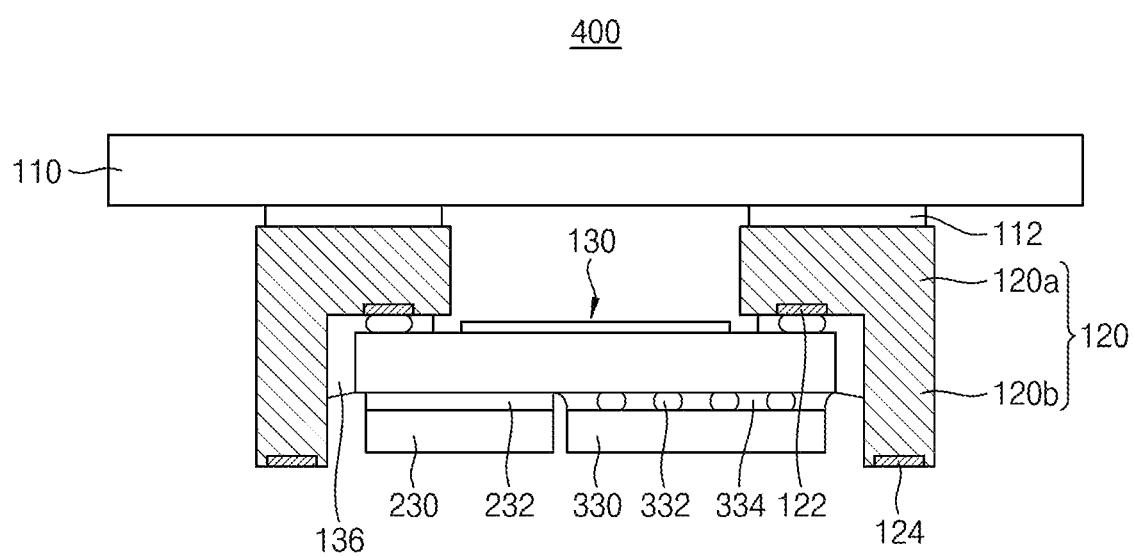
FIGS. 13 to 15 are cross-sectional views of semiconductor packages according to embodiments of the present inventive concept.
Figure 14:
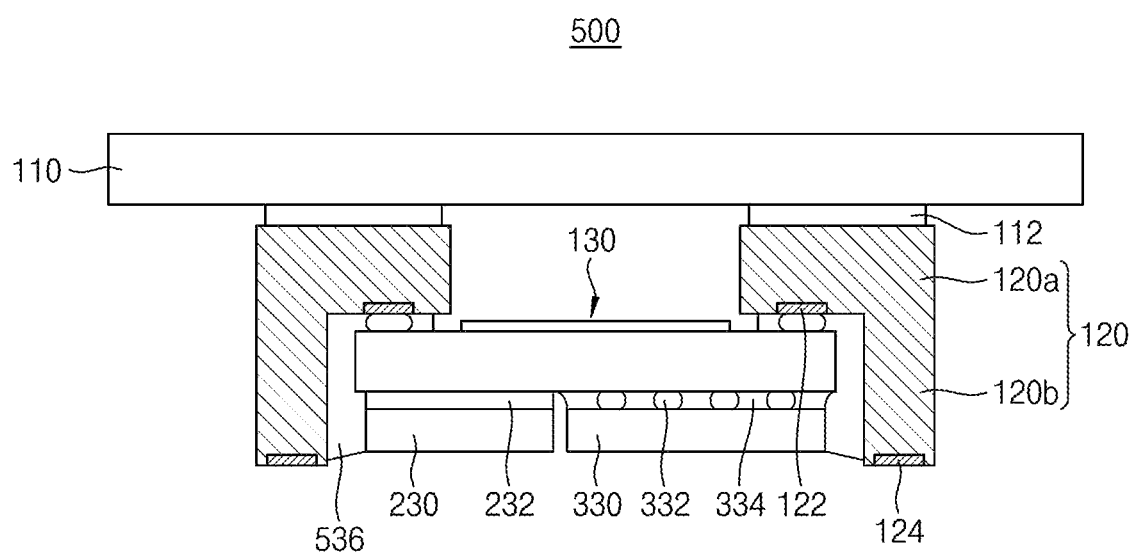
Figure 15:
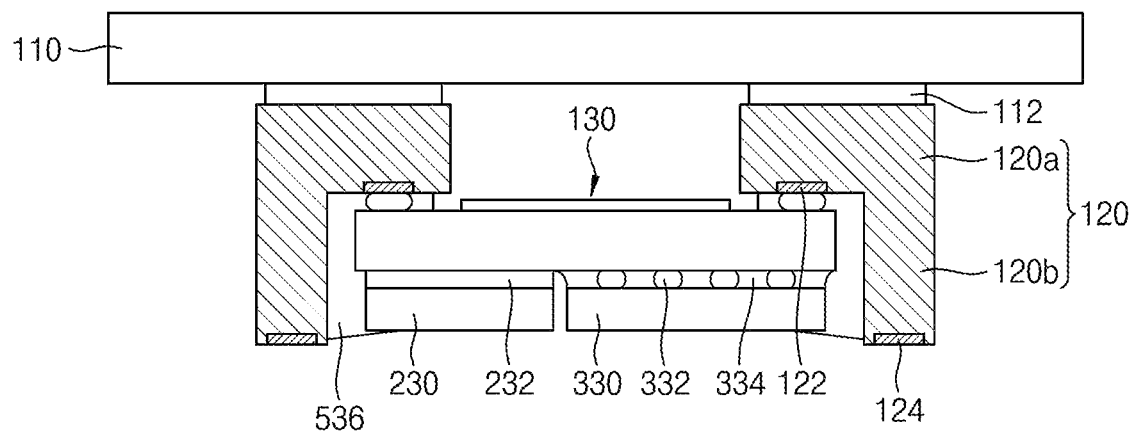

FIGS. 13 to 15 are vertical cross-sectional views of semiconductor packages according to embodiments of the present inventive concept.

Referring to FIG. 13, a semiconductor package according to an embodiment may include a heat spreader 230 and a semiconductor chip 330 disposed below an image sensor chip 130. In an embodiment, the heat spreader 230 may be attached to the image sensor chip 130 by an adhesive film 232, and the semiconductor chip 330 may be connected to the image sensor chip 130 by a bump 332. In an embodiment, the gap-fill member 136 may not directly contact the heat spreader 230 and the semiconductor chip 330. However, embodiments of the present inventive concept are not necessarily limited thereto.

Referring to FIG. 14, a semiconductor package 500 may have the same structure as the semiconductor package 400 shown in FIG. 13, except for a gap-fill member 536. In an embodiment shown in FIG. 14, the gap-fill member 536 may directly contact a heat spreader 230 and a semiconductor chip 330. For example, the gap-fill member 536 may contact lateral side surfaces of the heat spreader 230, an adhesive film 232, the semiconductor chip 330 and an underfill 334.

Referring to FIG. 15, a semiconductor package 500 may have the same structure as the semiconductor package 400 shown in FIG. 13, except for a gap-till member 536. In an embodiment, the gap-fill member 536 may partially cover (e.g., directly contact) lateral sides and lower surfaces of a heat spreader 230 and a semiconductor chip 330. However, the gap-fill member 536 may not cover a lower surface of a circuit board 120.

Figure 16:
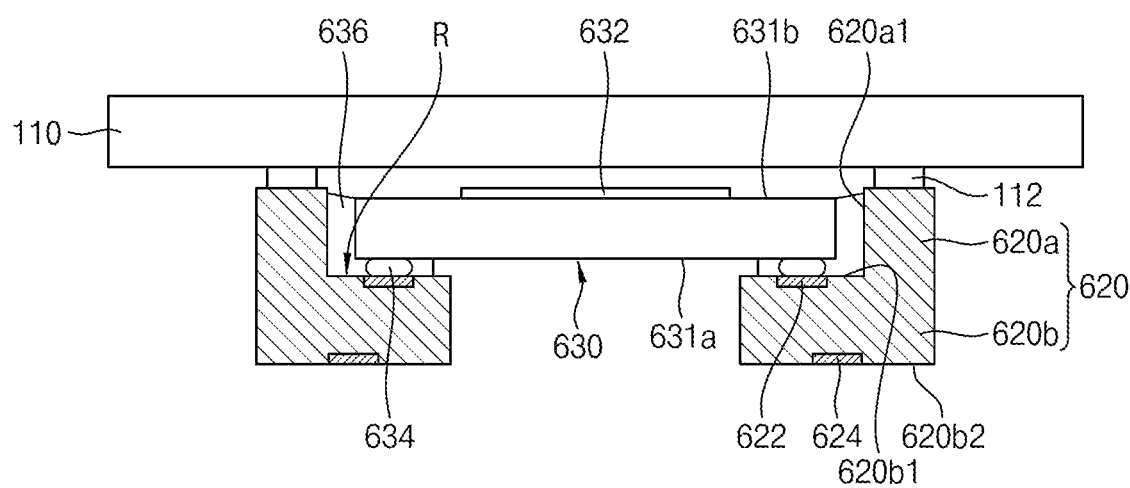
FIG. 16 is a cross-sectional view of a semiconductor package according to an embodiment of the present inventive concept.

FIG. 16 is a vertical cross-sectional view of a semiconductor package according to an embodiment of the present inventive concept.

Referring to FIG. 16, a semiconductor package 600 may include a circuit board 620 disposed below a transparent substrate 110, and an image sensor chip 630 mounted on the circuit board 620. In an embodiment, the semiconductor package 600 may not be formed through wafer-level packaging (WLP). For example, in an embodiment the semiconductor package 600 may be formed by mounting the image sensor chip 630 on the circuit board 620, and then attaching the transparent substrate 110 to the circuit board 620. In an embodiment, the transparent substrate 110 may have a greater horizontal width than the circuit board 620.

In an embodiment, the circuit board 620 may include a recessed region R formed at an upper surface thereof (e.g., a surface thereof facing the transparent substrate 110). The recessed region R may extend in a horizontal direction. In an embodiment, the circuit board 620 may include a first portion 620a directly contacting an adhesive 112, and a second portion 620b disposed below the first portion 620a. The first portion 620a and the second portion 620b may extend in the horizontal direction, and may have a frame shape in a plan view. In a cross-sectional view, the second portion 620b may extend further in the horizontal direction (e.g., towards the opening OP) than the first portion 620a. An inner side surface 620a1 of the first portion 620a and an upper surface 620b1 of the second portion 620b may be exposed by the recessed region R. In an embodiment, the second portion 620b may be formed integrally with the first portion 620a, and may be empty at a central portion thereof (e.g., in a horizontal direction), to expose the image sensor chip 630. The inner side surface 620a1 of the first portion 620a and the upper surface 620b1 of the second portion 620b may face the image sensor chip 630.

In an embodiment, the circuit board 620 may include an upper pad 622 and a lower pad 624. The upper pad 622 may be disposed at the upper surface 620b1 of the second portion 620b, and the lower pad 624 may be disposed at a lower surface 620b2 of the second portion 620b.

The image sensor chip 630 may be mounted on the circuit board 620 such that the image sensor chip 630 faces the transparent substrate 110. For example, the image sensor chip 630 may include a lower surface 631a, an upper surface 631b opposing the lower surface 631a (e.g., in a thickness direction of the semiconductor package 600), and an active array region 632 on the upper surface 631b. The lower surface 631a of the image sensor chip 630 may face the upper surface 620b1 of the second portion 620b of the circuit board 620, and a lateral side surface of the image sensor chip 630 may face the inner side surface 620a1 of the first portion 620a of the circuit board 620.

The semiconductor package 600 may further include a connection terminal 634 and a gap-fill member 636 disposed between the circuit board 620 and the image sensor chip 630. The connection terminal 634 may directly contact the lower surface 631*a* of the image sensor chip 630 and the upper surface 620*b*1 of the second portion 620*b* of the circuit board 620. For example, the connection terminal 634 may directly contact the upper pad 622 of the circuit board 620. The gap-fill member 636 may fill a space between the circuit board 620 and the image sensor chip 630. For example, the gap-fill member 636 may cover the inner side surface 620*a*1 of the first portion 620*a* and the upper surface 620*b*1 of the second portion 620*b* of the circuit board 620, and may cover lateral side surfaces and a portion of the lower surface 631*a* of the image sensor chip 630.

Figure 17:
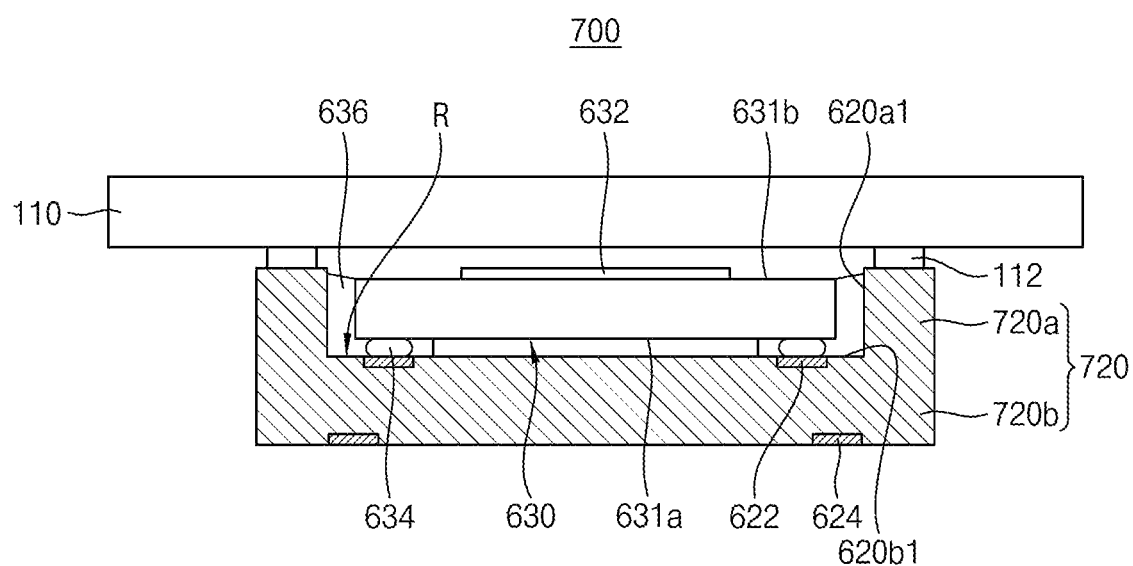
FIGS. 17 and 18 are cross-sectional views of semiconductor packages according to embodiments of the present inventive concept.
Figure 18:
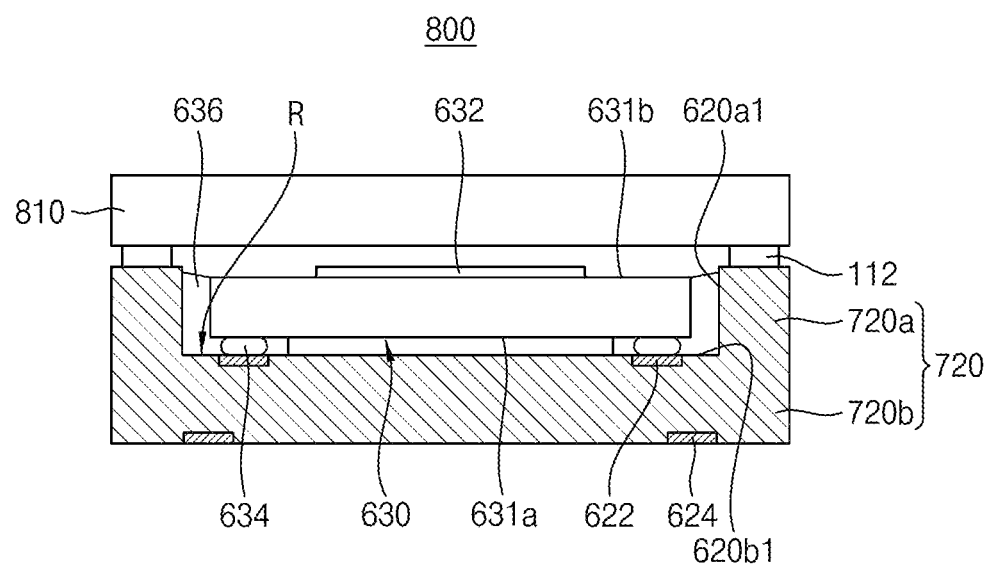

FIGS. 17 and 18 are vertical cross-sectional views of semiconductor packages according to some embodiments of the present inventive concept.

Referring to FIG. 17, a semiconductor package 700 may have the same structure as the semiconductor package 600 shown in 16, except for a circuit board 720. In an embodiment, the circuit board 720 may include a recessed region R formed at an upper surface thereof, and may include a first portion 720*a*, and a second portion 720*b* disposed below the first portion 720*a*. The recessed region R may expose an inner side surface 620*a*1 of the first portion 720*a* and an upper surface 620*b*1 of the second portion 720*b*. In an embodiment, the second portion 720*b* may not have an opening therein, and the cross-section thereof may have a plate shape which is rectangular, polygonal, circular, etc. The first portion 720*a* may have the form of a frame extending in a horizontal direction along an edge of the second portion 720*b*. Although a gap-fill member 136 is shown in FIG. 17 as partially covering a lower surface 131*a* of an image sensor chip 130, embodiments of the present inventive concept are not necessarily limited thereto. For example, in an embodiment, the gap-fill member 136 may completely cover the lower surface 131*a* of the image sensor chip 130.

Referring to FIG. 18, a semiconductor package 800 may include a transparent substrate 810 attached to a circuit board 720. In an embodiment, the transparent substrate 810 may have substantially the same horizontal width as the circuit board 720. In addition, although a second portion 720*b* of the circuit board 720 is shown in FIG. 18 as having the same structure as the second portion 720*b* of the circuit board 720 shown in FIG. 17, embodiments of the present inventive concept are not necessarily limited thereto. For example, in an embodiment, the circuit board 720 of the semiconductor package 800 may include an opening to expose a lower surface 631*a* of an image sensor chip 630. For example, the circuit board 720 may have the same structure as the circuit board 620 of the semiconductor package 600 shown in FIG. 16.

In accordance with embodiments of the present inventive concept, a semiconductor package may include a circuit board formed with a recessed region, and an image sensor chip may be mounted in the recessed region. Accordingly, a semiconductor package having a reduced size may be realized.

While embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:
1. A semiconductor package comprising:
   a circuit board having an opening therein, the circuit board comprising a first portion, and a second portion disposed below the first portion, the first portion protrudes further in a horizontal direction towards the opening than the second portion;
   a transparent substrate disposed on the circuit board;
   an image sensor chip mounted on the circuit board, the image sensor chip comprising an active array region facing the transparent substrate;
   a connection terminal directly contacting a lower surface of the first portion of the circuit board and an upper surface of the image sensor chip; and
   a gap-fill member covering the connection terminal and covering a portion of an upper surface of the image sensor chip and at least a portion of a lateral side surface of the image sensor chip,
   wherein the transparent substrate has a greater horizontal width than the circuit board.
2. The semiconductor package according to claim 1, wherein, in a plan view, the opening is rectangular and the circuit board has a frame shape.
3. The semiconductor package according to claim 1, wherein:
   the circuit board comprises a recessed region positioned on a lower surface of the circuit board; and
   the lower surface of the first portion and an inner side surface of the second portion are exposed by the recessed region.
4. The semiconductor package according to claim 3, wherein the image sensor chip is disposed in the recessed region.
5. The semiconductor package according to claim 1, wherein a lower surface of the image sensor chip is disposed at a higher level than a lower surface of the circuit board.
6. The semiconductor package according to claim 1, wherein:
   the circuit board comprises an upper pad disposed on the lower surface of the first portion, and a lower pad disposed on a lower surface of the second portion; and
   the connection terminal directly contacts the upper pad.
7. The semiconductor package according to claim 1, wherein the connection terminal comprises a plurality of connection terminals stacked in a vertical direction.
8. The semiconductor package according to claim 1, wherein the gap-fill member covers the lower surface of the first portion and an inner side surface of the second portion.
9. The semiconductor package according to claim 1, wherein the gap-fill member partially covers a lower surface of the image sensor chip.
10. The semiconductor package according to claim 1, wherein a distance between the upper surface of the image sensor chip and the lower surface of the first portion of the circuit board is in a range of about 30 μm to about 50 μm.
11. The semiconductor package according to claim 1, wherein a sum of thicknesses of the first portion and the second portion is in a range of about 500 μm to about 650 μm.
12. The semiconductor package according to claim 1, wherein the second portion has a thickness in a range of about 350 μm to about 500 μm.
13. The semiconductor package according to claim 1, wherein a horizontal width between an inner side surface of the second portion and the image sensor chip is in a range of about 250 to about 1,000 μm.

14. The semiconductor package according to claim 1, further comprising
a semiconductor chip disposed below the image sensor chip;
a bump interconnecting the semiconductor chip and the image sensor chip; and
an underfill covering the bump.

15. The semiconductor package according to claim 14, wherein a lower surface of the semiconductor chip is disposed at a higher level than a lower surface of the circuit board.

16. The semiconductor package according to claim 14, wherein the gap-fill member directly contacts lateral side surfaces of the semiconductor chip and the underfill.

17. A semiconductor package comprising:
a circuit board having an opening therein, the circuit board comprising a first portion, and a second portion disposed below the first portion, the second portion extends further in a horizontal direction than the first portion in a cross-sectional view;
a transparent substrate disposed on the circuit board;
an image sensor chip mounted on the circuit board, the image sensor chip comprising an active array region facing the transparent substrate;
a connection terminal contacting an upper surface of the second portion of the circuit board and a lower surface of the image sensor chip; and
a gap-fill member covering the connection terminal and covering at least portions of a lower surface and a lateral side surface of the image sensor chip,
wherein the transparent substrate has a greater horizontal width than the circuit board.

18. The semiconductor package according to claim 17, wherein:
the circuit board comprises a recessed region positioned on an upper surface thereof; and
an inner side surface of the first portion and the upper surface of the second portion are exposed by the recessed region.

19. The semiconductor package according to claim 17, wherein:
the circuit board comprises an upper pad disposed on the upper surface of the second portion, and a lower pad disposed on a lower surface of the second portion; and
the connection terminal directly contacts the upper pad.

20. A semiconductor package comprising:
a circuit board having an opening therein, the circuit board comprising a first portion, and a second portion disposed below the first portion, the first portion protrudes further in a horizontal direction towards the opening than the second portion;
a transparent substrate disposed on the circuit board;
an adhesive between the circuit board and the transparent substrate;
an image sensor chip mounted on the circuit board, the image sensor chip comprising an upper semiconductor chip comprising a photoelectric conversion device, a lower semiconductor chip bonded to the upper semiconductor chip, the lower semiconductor chip comprising a lower wiring layer, and an active array region on the upper semiconductor chip;
a connection terminal directly contacting a lower surface of the first portion of the circuit board and an upper surface of the image sensor chip; and
a gap-fill member covering the connection terminal and covering a portion of an upper surface of the image sensor chip and at least a portion of a lateral side surface of the image sensor chip,
wherein the transparent substrate has a greater horizontal width than the circuit board.

* * * * *